United States Patent
Kwak et al.

(10) Patent No.: US 7,804,716 B2
(45) Date of Patent: Sep. 28, 2010

(54) FLASH MEMORY DEVICE HAVING IMPROVED BIT-LINE LAYOUT AND LAYOUT METHOD FOR THE FLASH MEMORY DEVICE

(75) Inventors: Pan-suk Kwak, Suwon-si (KR); Doo-youl Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 101 days.

(21) Appl. No.: 12/222,073

(22) Filed: Aug. 1, 2008

(65) Prior Publication Data

US 2009/0034336 A1 Feb. 5, 2009

(30) Foreign Application Priority Data

Aug. 3, 2007 (KR) .................... 10-2007-0078203

(51) Int. Cl.
*G11C 16/06* (2006.01)
(52) U.S. Cl. ............ 365/185.2; 365/210.1; 365/185.17; 365/185.33
(58) Field of Classification Search ........... 365/210.1, 365/185.17, 185.2, 185.33
See application file for complete search history.

(56) References Cited

U.S. PATENT DOCUMENTS 5,902,493 A 5/1999 Bae
2005/0175937 A1 8/2005 Bae
2007/0070699 A1* 3/2007 Lee .................. 365/185.17
2007/0121359 A1* 5/2007 Kanda .................. 365/51

FOREIGN PATENT DOCUMENTS

JP 2001-244190 9/2001
KR 1020030002886 1/2003

* cited by examiner

*Primary Examiner*—Thong Q Le
(74) *Attorney, Agent, or Firm*—Harness, Dickey & Pierce, P.L.C.

(57) ABSTRACT

Provided are a flash memory device having an improved bit-line layout and a layout method for the flash memory device. The flash memory device in which bit lines are disposed based on double patterning technology (DPT), may include at least one main bit line connected to a cell string including a memory cell storing data, at least one dummy bit line disposed parallel to the at least one main bit line, and a common source line transferring a common source voltage, and disposed on a different layer from a layer on which the at least one main bit line and the at least one dummy bit line are disposed, wherein the at least one dummy bit line may include a first dummy bit line transferring a first voltage and a second dummy bit line transferring a second voltage.

22 Claims, 9 Drawing Sheets

US 7,804,716 B2

FLASH MEMORY DEVICE HAVING IMPROVED BIT-LINE LAYOUT AND LAYOUT METHOD FOR THE FLASH MEMORY DEVICE

PRIORITY STATEMENT

This application claims priority under 35 U.S.C. §119 to Korean Patent Application No. 10-2007-0078203, filed on Aug 3, 2007 in the Korean Intellectual Property Office (KIPO), the entire contents of which are incorporated herein by reference.

BACKGROUND

1. Field of Art

Example embodiments relate to a flash memory device and a layout method for the flash memory device, and more particularly, to a nonvolatile memory device which may have an improved bit-line layout and a layout method for the nonvolatile memory device.

2. Description of the Related Art

As mobile systems and other application systems are developed, demands for flash memory may constantly increase. A flash memory device may be a nonvolatile memory device that can be electrically erased and programmed. A non-volatile memory device may be a memory device that can retain stored information even in a state where power is not supplied. In addition, flash memory may consume less power than a storage medium based on magnetic disk memory and may have a fast access time like in a hard disk.

Flash memory may be classified into NOR flash memory and NAND flash memory according to the connection state between cells and bit lines. In particular, NAND flash memory may have a structure in which at least two cell transistors are connected in series to one bit line. In this regard, a large amount of data may be stored in a relatively small area.

In order to improve the characteristic of flash memory, flash memory devices may employ a dummy bit line that is not used to efficiently store data. The dummy bit line may be disposed between main bit lines which may be used to efficiently store data. Wiring disposed above the dummy and main bit lines may be connected to wiring disposed below the dummy and main bit lines via the dummy bit line. As an example, a common source line may be connected to a metal line disposed above the dummy bit line via the dummy bit line.

FIG. 1 is a circuit diagram of a conventional flash memory device 10. Referring to FIG. 1, the conventional flash memory device 10 may include a memory cell array 11 and a page buffer block 12. The memory cell array 11 may include a plurality of memory cells MCs which may be used to store data and a plurality of dummy cells DMCs which may not be used to efficiently store data. In addition, the memory cells MCs may be connected to each of a plurality of main bit lines BL0e through BL0o in series. The dummy cells DMCs may be connected to a dummy bit line DBL in series. In addition, a string selection line SSL, a plurality of word lines WL0 through WL31 and a ground selection line GSL may be disposed parallel to each other.

A common source line CSL may be disposed below the dummy bit line DBL and the main bit lines BL0e through BL0o so as to be approximately perpendicular to the dummy bit line DBL and the main bit lines BL0e through BL0o. A voltage serving as a source voltage of the memory cell MCs may be applied through the common source line CSL. However, a voltage of the common source line CSL may drop due to a resistance component of the common source line CSL, and thus the performance of the flash memory device 10 may deteriorate. In order to reduce or prevent the deterioration of the flash memory device 10, the dummy bit line DBL may be electrically connected to the common source line CSL, and a voltage may be applied to the common source line CSL through the dummy bit line DBL. A reference number "m" of FIG. 1 may refer to a structure whereby the dummy bit line DBL and the common source line CSL may be electrically connected.

FIG. 2 is a circuit diagram of a first page buffer 12_0 which may be included in the page buffer block 12 illustrated in FIG. 1. For example, main bit lines may be classified into even bit lines and odd bit lines. Each of the even bit lines and each of the odd bit lines may be connected to a single page buffer.

A first even bit line BL0e and a first odd bit line BL0o may be connected to the first page buffer 12_0. Generally, a page buffer may include a high voltage region operating at high voltage and a low voltage region operating at low voltage. A plurality of transistors T21 through T24 may be disposed in the high voltage region. The transistors T21 and T22 may be used to precharge and control a voltage of the first even bit line BL0e and a voltage of the first odd bit line BL0o. That is, the transistors T21 and T22 may transfer or shield a bit line power voltage BLPWR in response to shield control signals SHLDe and SHLDo. In addition, the transistors T23 and T24 may be used to select any one of the first even bit line BL0e and the first odd bit line BL0o. That is, the transistors T23 and T24 may connect the even bit line BL0e to a bit line BL0 or may connect the odd bit line BL0o to the bit line BL0, in response to bit line selection signals BLSLTe and BLSLTo.

In the meantime, a transistor T25 disposed in the low voltage region may control the connection between the first even bit line BL0e or the first odd bit line BL0o and the bit line BL0, in response to a shut off control signal BLSHF.

As the integration degree of semiconductor memory devices including flash memory devices increases, the width of and the interval between patterns may be reduced. Double patterning technology (DPT) may reduce the width and the interval of patterns.

When a core part (a memory cell array and a page buffer) of a flash memory device may be embodied based on DPT, the width of and the intervals between patterns used for forming a bit line may be reduced. However, as the intervals between the patterns may become reduced, a larger coupling capacitance may be generated between bit lines adjacent to each other. Likewise, a large coupling capacitance may also be generated between the main bit line BL and the dummy bit line DBL adjacent to the main bit line BL.

In this case, at a point of time of sensing the memory cell MC corresponding to the bit line BL adjacent to the dummy bit line DBL, a voltage of the dummy bit line DBL may drop greatly. Accordingly, since a voltage of the main bit line BL adjacent to the dummy bit line DBL may drop greatly, data of the memory cell MC may not be accurately sensed.

In order to overcome this problem, a bit-line layout and a circuit related to the bit line may be changed. However, the processes involved in performing layout of a bit line using DPT may be complicated and expensive, given that additional operations may be required in order to change the configuration.

SUMMARY

Example embodiments provide a flash memory device having a bit line structure which may be optimized or improved using double patterning technology (DPT), and a layout method for the flash memory device.

Example embodiments provide a flash memory device in which bit lines may be disposed based on double patterning technology (DPT). The flash memory device may comprise at least one main bit line connected to a cell string comprising a memory cell storing data; at least one dummy bit line disposed parallel to the at least one main bit line; and a common source line transferring a common source voltage, and disposed on a different layer from a layer on which the at least one main bit line and the at least one dummy bit line are disposed, wherein the at least one dummy bit line may comprise a first dummy bit line transferring a first voltage and a second dummy bit line transferring a second voltage.

The first dummy bit line may be adjacent to the at least one main bit line, and the second dummy bit line may not be adjacent to the at least one main bit line.

The first dummy bit line may be electrically connected to a well of a semiconductor substrate, and the second dummy bit line may be electrically connected to a power source applying a common source voltage.

The well may be a p-well comprising p-type impurities.

The second dummy bit line may be further connected to the common source line via a contact hole.

The at least one main bit line and the at least dummy bit lines may be disposed so as to have the same width and interval therebetween.

The flash memory device may further comprise a first layer on which the at least one main bit line and the at least one dummy bit line are disposed; and a second layer disposed between the first layer and the semiconductor substrate in order to electrically connect the first layer to the semiconductor substrate, and comprising a metal line.

The second dummy bit line may be electrically connected to a voltage source applying a common source voltage, and may be electrically connected to the common source line via the metal line of the second layer.

The flash memory device may be a NAND-type flash memory.

Example embodiments, may provide a flash memory device comprising bit lines disposed across a cell array region and a page buffer region based on DPT. The bit lines may include at least one main bit line connected to a memory cell that may be used to store data, and at least one dummy bit line connected to a dummy cell that may not used to store data, wherein the at least one main bit line and the at least one dummy bit line may be arranged based on DPT, the at least one main bit line and the at least one dummy bit line may be disposed to have the same width and interval therebetween, and wherein the at least one main bit line and/or the at least one dummy bit line may not comprise a trim region in the cell array region and the page buffer region since a trim process is not performed.

Example embodiments may provide a flash memory device in which bit lines are disposed based on DPT. The flash memory device may include at least one main bit line connected to a cell string comprising a memory cell storing data; at least one dummy bit line disposed parallel to the at least one main bit line; a common source line transferring a common source voltage, and disposed on a different layer from a layer on which the at least one main bit line and the at least one dummy bit line are disposed; and a page buffer temporally storing data when the flash memory device reads and/or writes the data, and comprising a first region to which a high voltage is applied and a second region to which a low voltage is applied. The first region and the second region may be electrically connected to each other via a conductive line disposed on a different layer from the layer on which the at least one main bit line and the at least one dummy bit line are disposed.

Example embodiments may provide a layout method for a flash memory device based on DPT. The method may comprise disposing a plurality of word lines transferring a word line voltage and a common source line transferring a common source voltage; disposing bit lines so as to have the same width and interval therebetween, wherein the bit lines may include at least one main bit line that may be used to efficiently store data and at least one dummy bit line that may not be used to efficiently store data; and applying a first voltage to a first dummy bit line of the at least one dummy bit line, and applying a second voltage to a second dummy bit line of the at least one dummy bit line, wherein at least one of the at least one main bit line and the at least one dummy bit line do not comprise a trim region in the cell array region and the page buffer region since a trim process is not performed.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
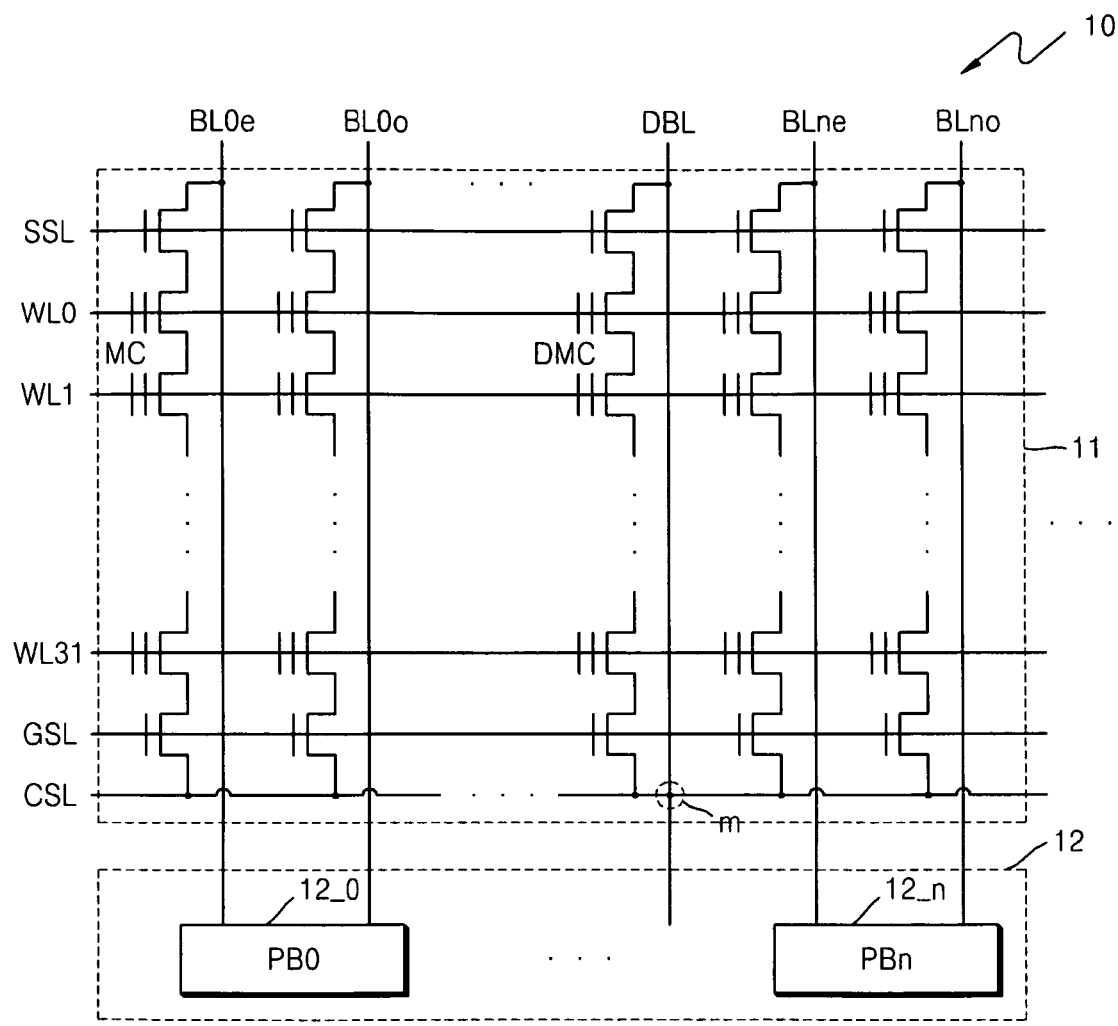
FIG. 1 is a circuit diagram of a conventional flash memory device.
Figure 2:
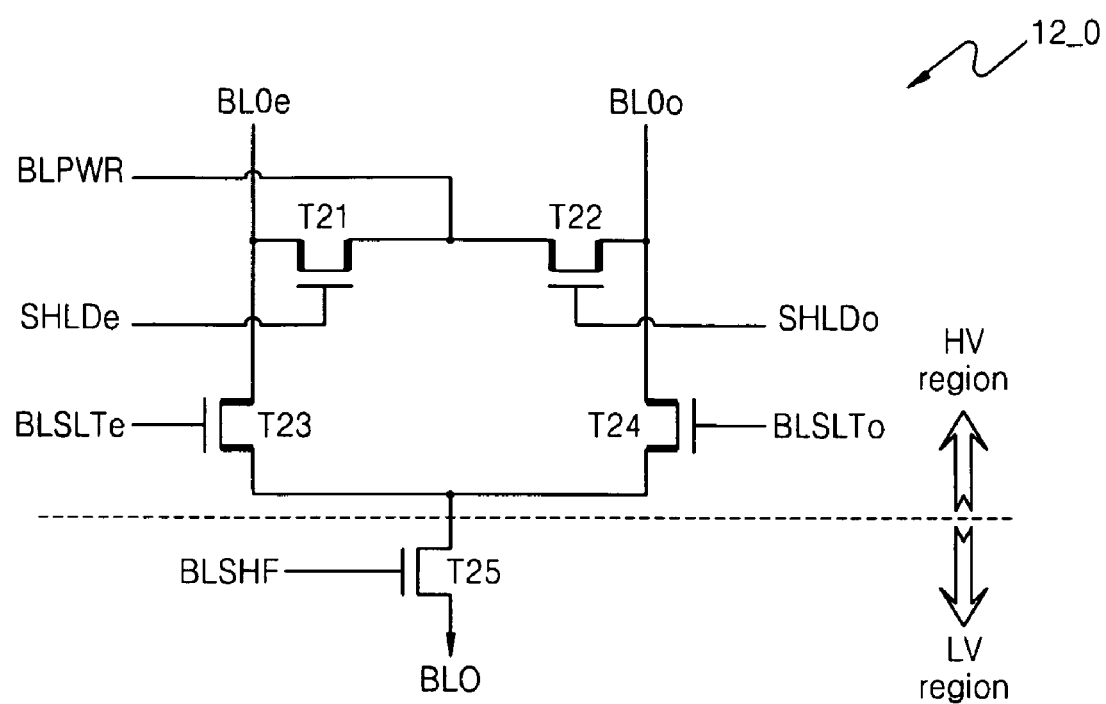
FIG. 2 is a circuit diagram of a first page buffer included in a page buffer block illustrated in FIG. 1.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
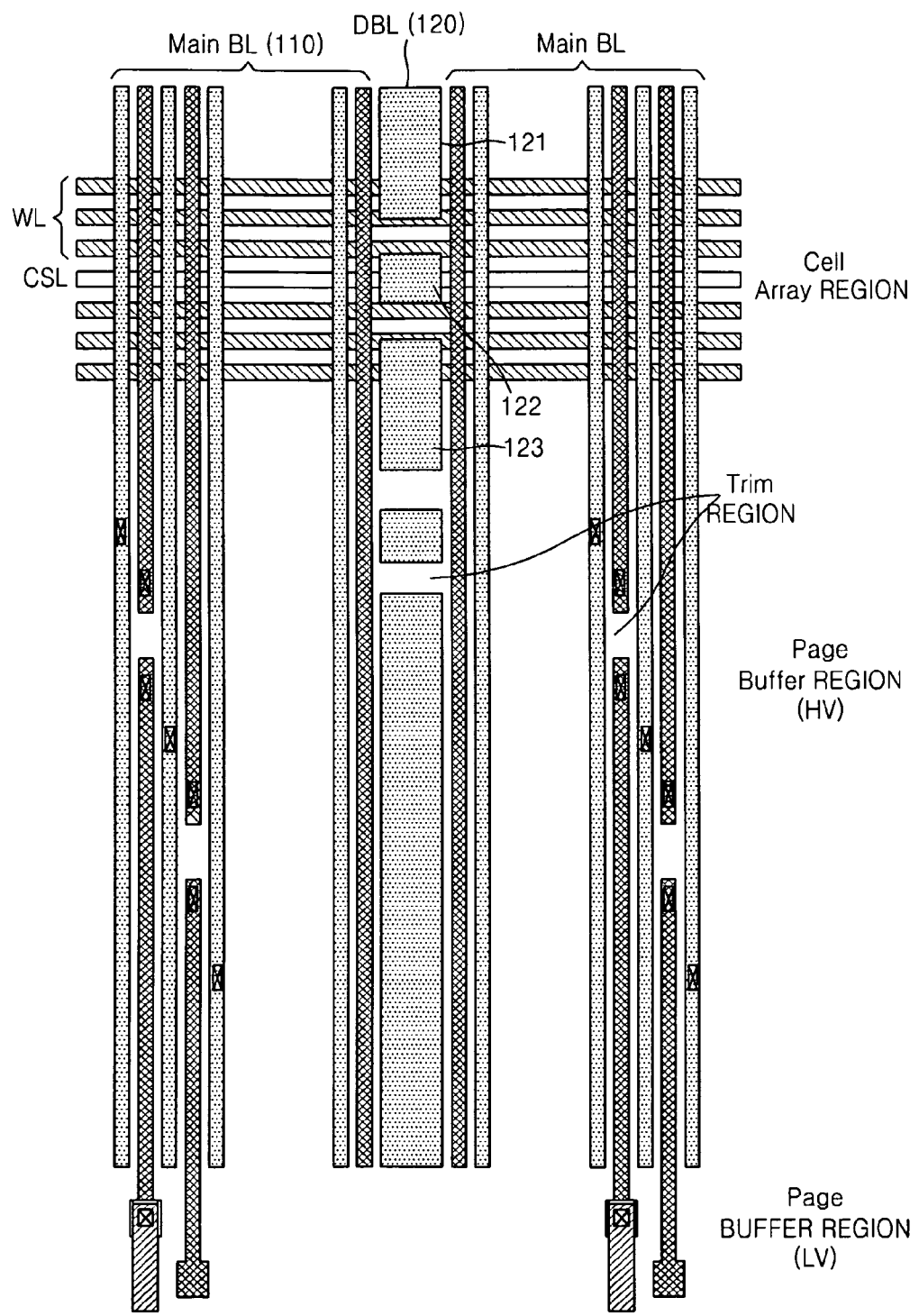
FIG. 3 illustrates a bit line layout based on double patterning technology (DPT)

FIG. 3 illustrates a bit-line layout based on double patterning technology (DPT). Referring to FIG. 3, a plurality of main bit lines 110 may be disposed parallel to each other. A dummy bit line DBL 120 where data may not be efficiently stored may be disposed between the main bit lines 110. Below a layer on which the main bit lines 110 and the dummy bit line DBL 120 are disposed, a plurality of word lines WLs and a common source line CSL may be disposed so as to be approximately perpendicular to the main bit lines 110 and the dummy bit line DBL 120. A memory cell that is used to store data and a dummy cell that is not used to efficiently store data may be disposed on a semiconductor substrate. A cell string including a plurality of memory cells that are connected in series may be connected to each of the main bit lines 110. In addition, a cell string including a plurality of dummy cells may be connected to the dummy bit line DBL 120.

In FIG. 3, a cell array region in which memory cells and dummy cells may be disposed and a page buffer region that may be used to transmit and receive data to and from the cell array region are illustrated. As an example, the cell array region illustrated in FIG. 3 may correspond to NAND-type flash memory. The page buffer region may include a high voltage region HV operating at high voltage and a low voltage region LV operating at low voltage. In addition, the main bit lines 110 and the dummy bit line DBL 120 may be disposed across the cell array region and the page buffer region.

A common source voltage may be applied to the dummy bit line DBL 120 which may be disposed between the main bit lines 110. Although not illustrated in FIG. 3, a predetermined metal line transferring the common source voltage may be disposed above the layer on which the main bit lines 110 and the dummy bit line DBL 120 are disposed. The dummy bit line DBL 120 may be electrically connected to the predetermined metal line. The common source voltage transferred through the predetermined metal line may be applied to the common source line CSL through the dummy bit line DBL 120.

In order to remove an adverse effect due to a coupling capacitance between the bit lines, a trim process may be performed on the dummy bit line DBL 120, which may be disposed based on DPT, so that the dummy bit line DBL 120 may include a plurality of bit line sections 121 through 123. A middle bit line section 122 from among the bit line sections 121 through 123 may be electrically connected to the common source line CSL via a contact hole. Thus, the common source line CSL may be connected to the metal line, which may be disposed on the layer on which the main bit lines 110 and the dummy bit line DBL 120 may be disposed and may transfer the common source voltage, through the middle bit line section 122.

The other two bit line sections 121 and 123 may be electrically connected to a WELL region of the semiconductor substrate. The bit line sections 121 and 123 may be electrically connected to a P-WELL region including p-type impurities (not shown). Most of the dummy bit line DBL 120 (e.g., the bit line sections 121 and 123) may be electrically connected to the P-WELL region, and a portion of the middle bit line section 122 which may cross the common source line CSL may be electrically connected to the common source line CSL.

Figure 4:
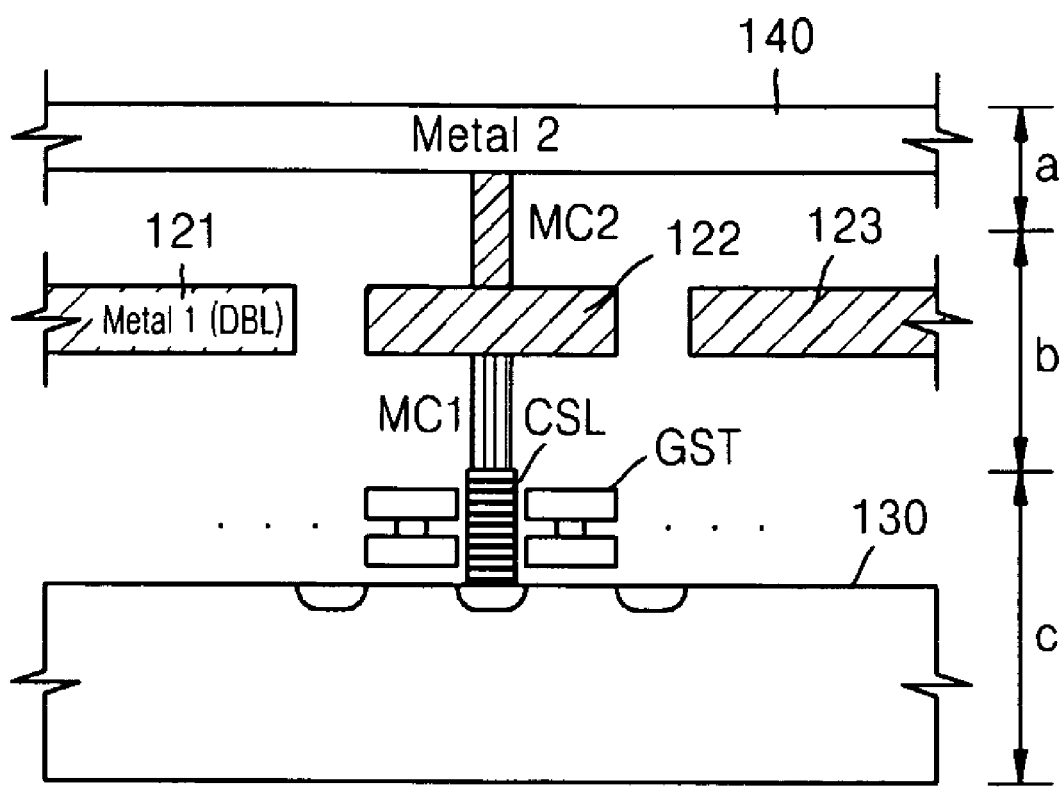
FIG. 4 is a cross-sectional view of a contact structure of a dummy bit line illustrated in FIG. 3.

FIG. 4 is a cross-sectional view of a contact structure of the dummy bit line DBL 120 illustrated in FIG. 3. Referring to FIG. 4, a plurality of memory cells and a plurality of dummy cells may be disposed on a semiconductor substrate 130, and the common source line CSL and a ground selection transistor GST may also be disposed on the semiconductor substrate 130.

Main bit lines and dummy bit lines may be disposed on a layer "b" which may be disposed above the memory cells and the dummy cells. For example, the main bit lines and the dummy bit lines may be disposed to be approximately perpendicular to a plurality of word lines and the common source line CSL. In FIG. 4, a portion of the dummy bit line DBL 120, which includes a trim region, is illustrated. As described with reference to FIG. 3, a trim process may be performed on the dummy bit line DBL 120 so that the dummy bit line DBL 120 may include the bit line sections 121 through 123.

The middle bit line section 122, from among the bit line sections 121 through 123, may be electrically connected to a metal line Metal 2 140, which may be disposed on a layer "a" which may be disposed above the layer "b", via a metal contact MC2. The main bit lines and the dummy bit lines may be disposed on the layer "b". In addition, the middle bit line section 122 may be electrically connected to the common source line CSL, which may be disposed on the semiconductor substrate 130, via a metal contact MC1. As described with reference to FIG. 3, the common source voltage, which may be transferred through the metal line Metal 2 140, may be applied to the common source line CSL via the metal contact MC2, the middle bit line section 122, and the metal contact MC1. The bit line sections 121 and 123 may be electrically connected to the P-WELL region (not shown) including p-type impurities, which may be disposed on the semiconductor substrate 130.

However, if the bit lines are patterned based on DPT, forming the trim regions may be disadvantageous from a process point of view. For example, when DPT is used, an additional trim process and an additional separate trim layer, which may be required due to the trim process, may be required when performing layout of the bit lines. In addition, as illustrated in FIG. 3, some of the main bit lines 110 may also need to have a trim region since the main bit lines may need to be classified into main bit lines applying a voltage to the high voltage region of the page buffer region and main bit lines applying a voltage to the low voltage region of the page buffer region.

In addition, since it may be difficult to reduce the contact size between the dummy bit line DBL 120 and the metal line disposed above the dummy bit line DBL 120, the width of the dummy bit line DBL 120 may be greater than the width of the main bit lines 110. Thus, even though various patterns may be required for the bit-line layout, it may be difficult to form various patterns in process of DPT.

Figure 5:
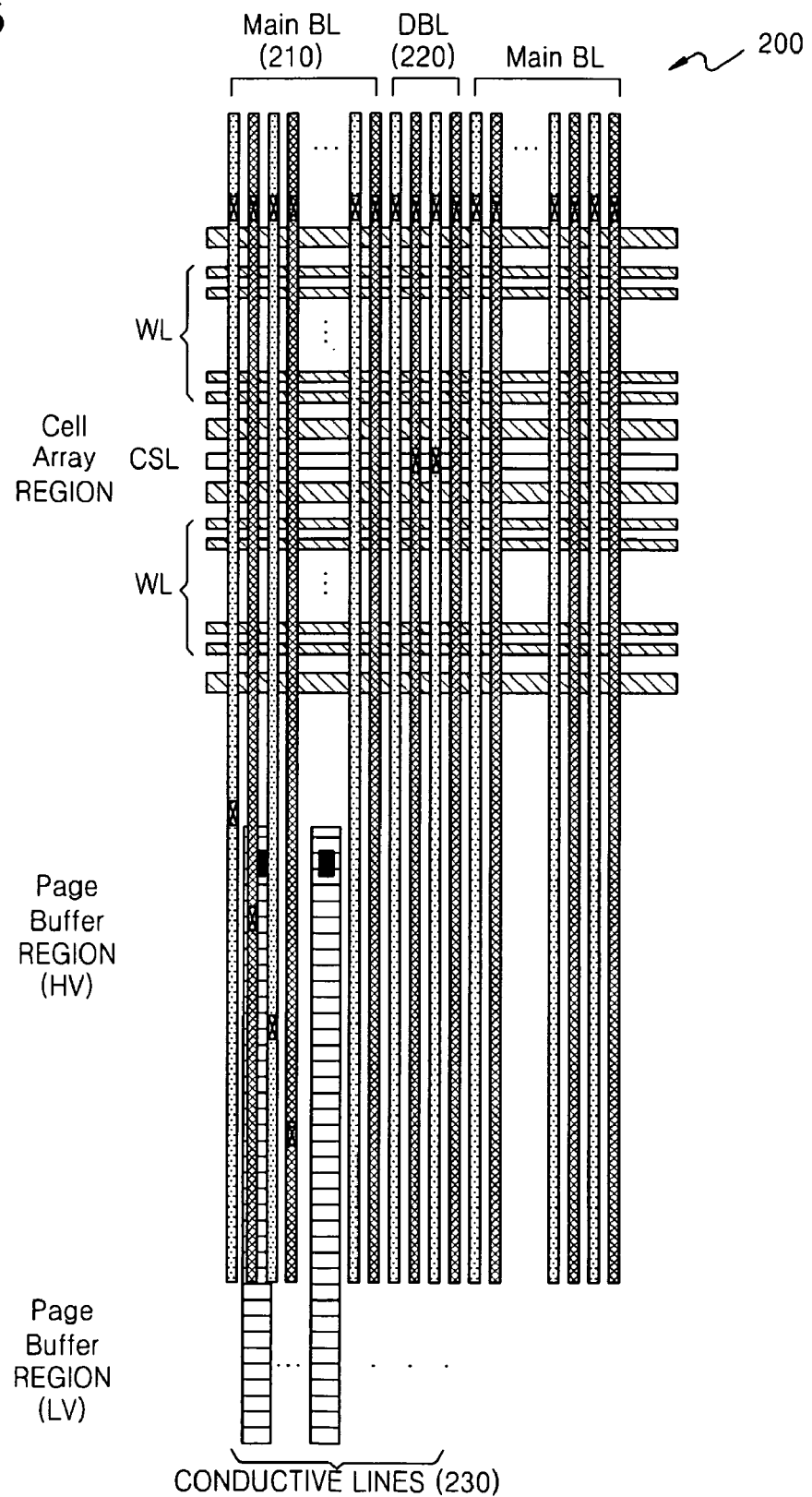
FIG. 5 illustrates a bit-line layout based on DPT, according to example embodiments.
Figure 6:
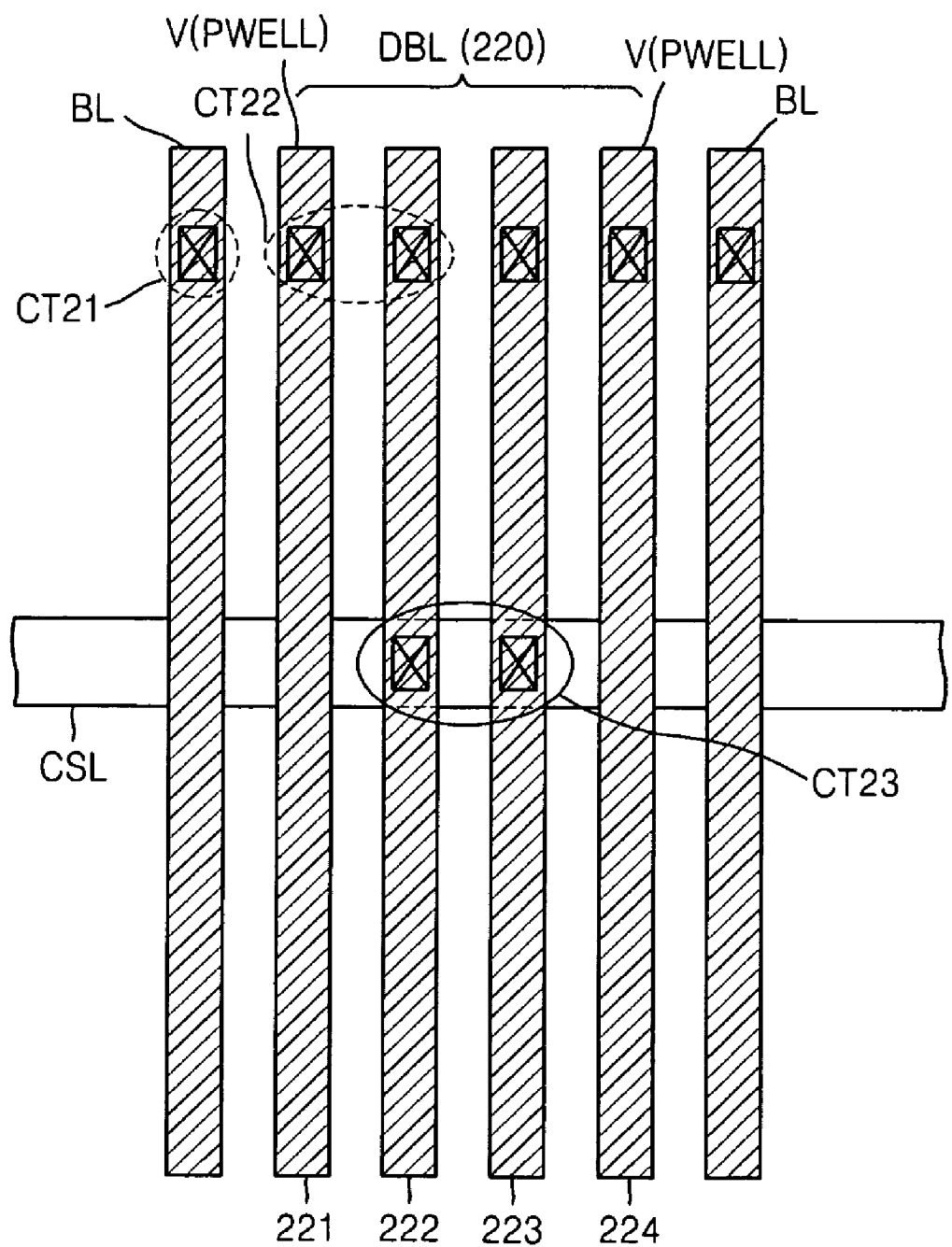
FIG. 6 illustrates dummy bit lines of the bit-line layout of FIG. 5 according to example embodiments.

FIG. 5 illustrates a bit-line layout 200 based on DPT, according to example embodiments. FIG. 6 illustrates dummy bit lines DBL 220 of the bit-line layout of FIG. 5 according to example embodiments.

Referring to FIGS. 5 and 6, in bit line layout 200, a plurality of main bit lines Main BL 210 may be disposed parallel to each other. The dummy bit lines DBL 220, which may not be used to efficiently store data, may be disposed between the main bit lines 210. The dummy bit lines DBL 220, which may be disposed between the main bit lines Main BL 210, may include at least two dummy bit lines. The main bit lines Main BL 210 and the dummy bit lines DBL 220 may be disposed across a cell array region and a page buffer region.

In the cell array region, below a layer on which the main bit lines Main BL 210 and the dummy bit lines DBL 220 may be disposed, a plurality of word lines and a common source line may be disposed to be approximately perpendicular to the main bit lines Main BL 210 and the dummy bit lines DBL 220. Each of the main bit lines Main BL 210 may be electrically connected to a memory cell via a contact hole.

The dummy bit lines DBL 220 may be disposed parallel to the main bit lines Main BL 210 such that the width of and the interval between the dummy bit lines DBL 220 may be approximately the same as those of the main bit lines Main BL 210. According to example embodiments, when performing layout of bit lines based on DPT, since a separate trim process may not be required, the dummy bit lines DBL 220 may not include a trim region.

As illustrated in FIGS. 5 and 6, in the page buffer region, the main bit lines Main BL 210 may not include a trim region. Instead of the trim region, conductive lines 230 may be disposed in the page buffer region. That is, the page buffer region may include a high voltage region HV and a low voltage region LV. In the high voltage region HV, signals may be transmitted through the main bit lines Main BL 210. In the low voltage region LV, signals may be transmitted through the conductive lines 230.

The conductive lines 230 may be disposed below the layer on which the main bit lines Main BL 210 and the dummy bit lines DBL 220 are disposed. The conductive lines 230 may be disposed on a layer interposed between a semiconductor substrate and the layer on which the main bit lines Main BL 210 and the dummy bit lines DBL 220 may be disposed. In addition, each of the conductive lines 230 may correspond to two of the main bit lines Main BL 210. The conductive lines 230 may be disposed across the high voltage region and low voltage region of the page buffer.

In FIG. 6, as an example of the arrangement of dummy bit lines, four dummy bit lines DBL 220 may be disposed between two main bit lines BL. However, it will be obvious to one of ordinary skill in the art that the number of dummy bit lines may be more or less than four if necessary. In addition, the two main bit lines BL may be disposed adjacent to and on both sides of the dummy bit lines DBL 220, respectively. The common source line CSL may be disposed in a direction perpendicular to a direction in which the dummy bit lines DBL 220 and the main bit lines BL are arranged.

According to example embodiments, a first voltage may be applied to some (hereinafter, referred to as first dummy bit lines 221 and 224) of the dummy bit lines DBL 220 (e.g., four dummy bit lines), and a second voltage may be applied to the remaining dummy bit lines (hereinafter, referred to as second dummy bit lines 222 and 223). In more detail, the first dummy bit lines may be electrically connected to a P-WELL, and a common source voltage Vcsl may be applied to the second dummy lines. In particular, in the dummy bit lines DBL 220 disposed parallel to each other, the first dummy bit lines 221 and 224 disposed adjacent to the main bit lines BL may be electrically connected to the P-WELL. The common source voltage Vcsl may be applied to the second dummy bit lines 222 and 223, which may be disposed in the middle of the dummy bit lines DBL 220.

In the main bit lines BL and the dummy bit lines DBL 220, the main bit lines BL may be electrically connected to memory cells of a cell string via a contact hole CT21 in each of the main bit lines BL. In FIG. 6, the dummy bit lines DBL 220 may be electrically connected to dummy cells via a contact hole CT22 in each of the dummy bit lines DBL 220. However, since the dummy cells may not be used to efficiently store data, a contact hole in each of the dummy bit lines DBL 220 may not be required.

In the meantime, the second dummy bit lines 222 and 223 which may not be adjacent to the main bit lines BL may be electrically connected to the common source line CSL via a contact hole CT23 in each of the second dummy bit lines 222 and 223. Thus, the second dummy bit lines 222 and 223 may be used to connect the common source line CSL to a predetermined power source applying the common source voltage Vcsl.

According to example embodiments, in a flash memory having the configuration of FIGS. 5 and 6, a voltage of the first dummy bit lines 221 and 224, which may be adjacent to the main bit lines BL, may correspond to a voltage Vpwell of the P-WELL. Thus, at a point of time of sensing data of a memory cell, a voltage of a dummy bit line may not greatly drop. In addition, the voltage of a main bit line adjacent to a dummy bit line may be reduced or prevented from greatly dropping due to a coupling capacitance, and thus data may be accurately sensed. In addition, since a common source voltage may be applied to the common source line CSL by using the second dummy bit lines 222 and 223, which may not be adjacent to the main bit line BL, the voltage of the common source line CSL may be reduced or prevented from dropping.

Figure 7:
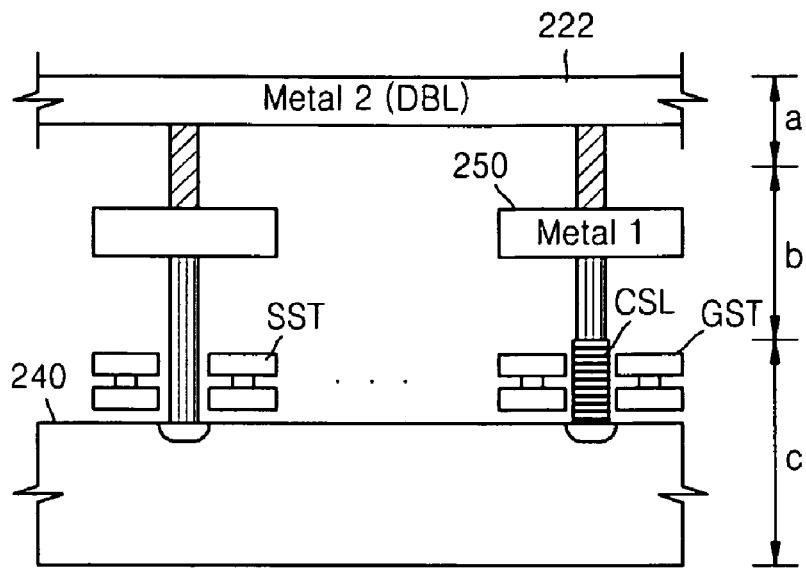
FIG. 7 is a cross-sectional view of a contact structure of the dummy bit lines illustrated in FIG. 6 according to example embodiments.

FIG. 7 is a cross-sectional view of a contact structure of one of the second dummy bit lines 222 (i.e., the second dummy bit line 222 is not adjacent to any of the main bit lines) illustrated in FIG. 6. A bit line layer "a" on which the main bit lines Main BL 210 and the dummy bit lines DBL 220 may be located, may be disposed above a semiconductor substrate layer "c" on which a plurality of memory cells, a dummy cell, and a ground selection transistor GST may be disposed. An interlayer "b", where at least one metal line Metal 1 may be disposed, may be disposed between the bit line layer "a" and the semiconductor substrate layer "c". A plurality of word lines and the common source line CSL, which may be disposed on the semiconductor substrate layer "c", may be disposed to be approximately perpendicular to the main bit lines Main BL 210 and the dummy bit lines DBL 220. A metal line 250 of the at least one metal line Metal 1, which may be disposed in the interlayer "b", may be disposed to be approximately perpendicular to the main bit lines Main BL 210 and the dummy bit lines DBL 220. A common source voltage may be applied to the common source line CSL through the metal line 250.

The dummy bit line 222 (hereinafter, referred to as a second dummy bit line 222) illustrated in FIG. 7 may be an example of a second dummy bit line, from among the dummy bit lines DBL 220, which is not adjacent to the main bit lines Metal BL 210. As described above, the second dummy bit line 222 may be connected to a predetermined voltage source. The predetermined voltage source may be a common source voltage (not shown). In addition, the second dummy bit line 222 may be connected to the common source line CSL via the metal line 250 of the interlayer "b". In FIG. 7, the second dummy bit line 222 may be electrically connected to a string selection transistor SST of a cell string via the metal line 250 of the interlayer "b". However, since the dummy bit lines DBL 220 may not be used to efficiently store data, the second dummy bit line 222 may not have to be electrically connected to the string selection transistor SST.

According to example embodiments, in a flash memory having the configuration of FIG. 7, a metal line transferring a common source voltage may not be disposed above the dummy bit lines DBL 220. Increasing the width of the dummy bit lines DBL 220 in order to ensure contact between the dummy bit lines DBL 220 and the metal line may not be required. Thus, when performing a bit-line layout, the widths of and the intervals between the dummy bit lines DBL 220 may be approximately the same as those of the main bit lines Main BL 210. Such structure may be advantageous for performing a bit-line layout based on DPT. In addition, even though a trim region may not be included in the dummy bit lines DBL 220, since the performance of a flash memory device may be reduced or prevented from deteriorating due to coupling capacitance between the main bit lines Main BL 210 and the dummy bit lines DBL 220, a separate trim process may not be required when performing a bit-line layout based on DPT.

Figure 8A:
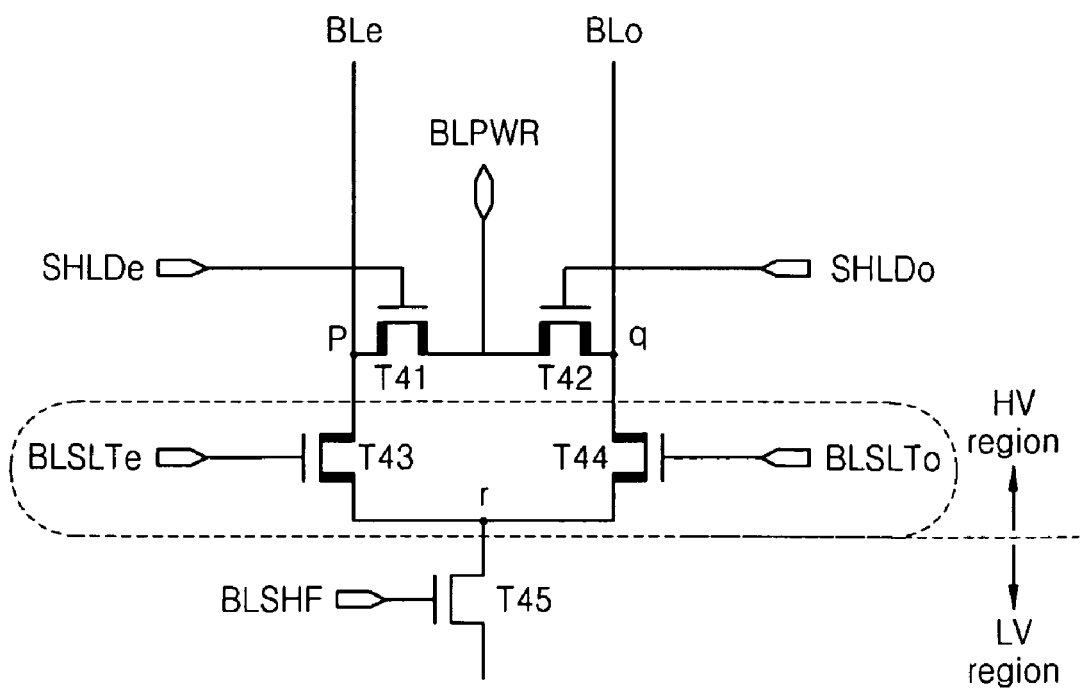
FIG. 8A is a circuit diagram of a page buffer according to example embodiments.
Figure 8B:
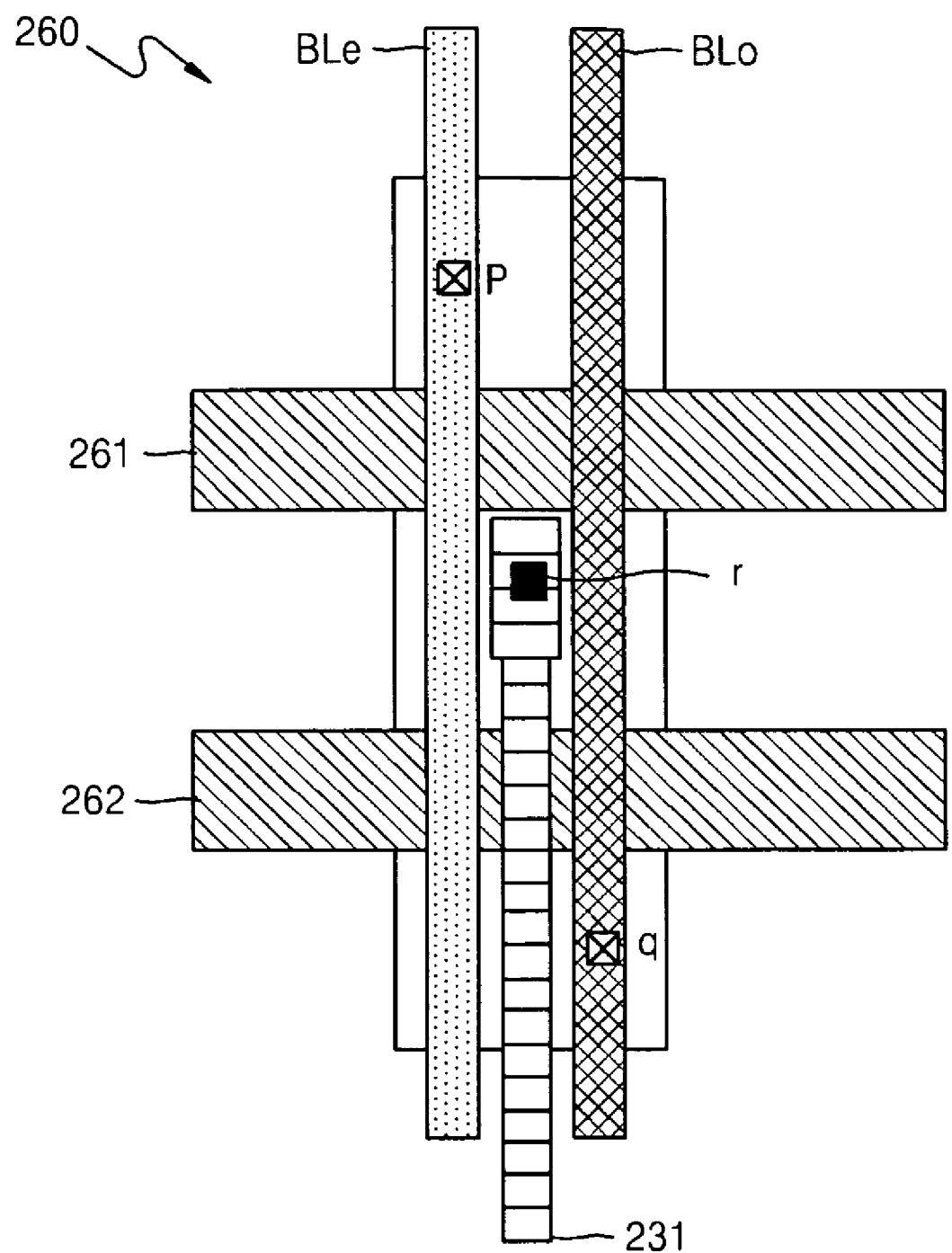
FIG. 8B illustrates a layout of a part of a circuit of the page buffer of FIG. 8A according to example embodiments.

FIG. 8A is a circuit diagram of a page buffer, according to example embodiments. FIG. 8B is a layout of a part of the page buffer of FIG. 8A, according to example embodiments.

Referring to FIG. 8A, the page buffer may include a high voltage region and a low voltage region. The high voltage region of the page buffer may include transistors T41 and T42 which may precharge and control a voltage of an even bit line BLe and a voltage of an odd bit line BLo, and transistors T43 and T44 which may select any one of the even bit line BLe and the odd bit line BLo. In the meantime, a transistor T45, which may be disposed in the low voltage region, may control a signal of the even bit line BLe or a signal of the odd bit line BLo to be transmitted to the low voltage region of the page buffer, in response to a shut off control signal BLSHF.

FIG. 8B illustrates a layout of a part 260 (i.e., the transistors T43 and T44) of the page buffer of FIG. 8A, according to example embodiments. In FIG. 8B, reference number 231 may refer to a conductive line which may connect the high voltage region to the low voltage region of the page buffer, reference number 261 may refer to a gate line of the transistor T43, and reference number 262 may refers to a gate line of the transistor T44.

According to example embodiments, in flash memory having the page buffer of FIGS. 8A and 8B, the high voltage region of the page buffer may be electrically connected to the low voltage region of the page buffer via the conductive line 231 that may be separately formed from a bit line, instead of via the bit line. Conventionally, a signal may be transferred from the high voltage region to the low voltage region by any one of the even bit line BLe and the odd bit line BLo. However, according to example embodiments, as illustrated in FIG. 8B, a signal may be transferred via the conductive line 231.

The conductive line 231 may be disposed between a layer on which bit lines may be disposed and a semiconductor substrate, and may be electrically connected to an active region of the semiconductor substrate via a contact hole "r". The single conductive line 231 may correspond to a pair of bit lines including the even bit line BLe and the odd bit line BLo. In FIG. 8B, the conductive line 231 may be illustrated as being disposed between the even bit line BLe and the odd bit line BLo for convenience of description. However, example embodiments are not limited thereto and the conductive line 231 may be electrically connected to a transistor defined by the gate lines 261 and 262.

Accordingly, a trim process in order to classify the bit lines into a bit line to which a high voltage is applied and a bit line to which a low voltage is applied, may not be required.

Figure 9:
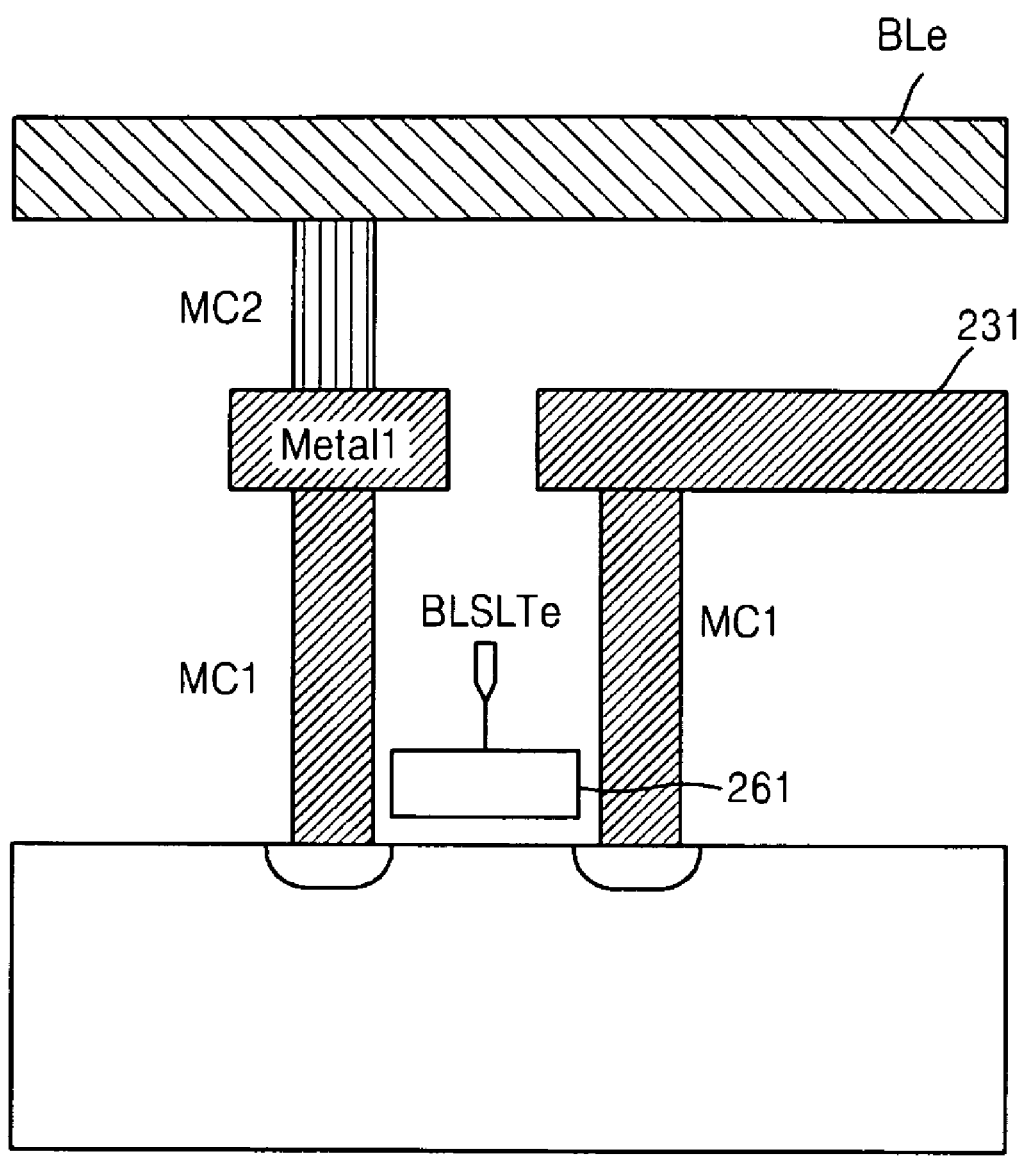
FIG. 9 is a cross-sectional view of a contact structure of the page buffer of FIGS. 8A and 8B according to example embodiments.

FIG. 9 is a cross-sectional view of a contact structure of the page buffer of FIGS. 8A and 8B, according to example embodiments. In FIG. 9, the even bit line BLe is illustrated as an example of a bit line disposed above the conductive line 231. In addition, the even bit line BLe is electrically connected to the active region of the semiconductor substrate via a predetermined metal line Metal 1 disposed on a layer on which the conductive line 231 is disposed, but example embodiments are not limited thereto. That is, the even bit line BLe may be connected to the active region via a single contact without the metal line Metal 1. The conductive line 231 may be connected to the transistor T43 and the even bit line BLe via the metal contact MC1. Although not illustrated in FIG. 9, the conductive line 231 may also be connected to the transistor T44 and the odd bit line BLo. The conductive line 231 may transmit a signal of whichever of the even bit line BLe and the odd bit line BLo is selected in response to the bit line selection signals BLSLTe and BLSLTo, to the low voltage region.

The flash memory device and the layout method for the same according to example embodiments may be advantageous for performing a bit-line layout based on DPT in that main bit lines and dummy bit lines in the flash memory device may be formed to have the same patterns. In addition, since a separate trim region may not be required in a bit line, a separate trim process may not be required when performing a bit-line layout based on DPT.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A flash memory device in which bit lines are disposed based on double patterning technology (DPT), the flash memory device comprising:
   one or more main bit lines connected to a cell string including a memory cell storing data;
   a plurality of dummy bit lines disposed parallel to the one or more main bit lines; and
   a common source line transferring a common source voltage, and disposed on a different layer from a layer on which the one or more main bit lines and the plurality of dummy bit lines are disposed,
   wherein the plurality of dummy bit lines includes a first dummy bit line transferring a first voltage and a second dummy bit line transferring a second voltage, and the first dummy bit line is disposed parallel to the second dummy bit line, and
   wherein the first dummy bit line is adjacent to the at least one main bit line, and the second dummy bit line is not adjacent to the at least one main bit line.

2. The flash memory device of claim 1, wherein the first dummy bit line is electrically connected to a well of a semiconductor substrate, and
   wherein the second dummy bit line is electrically connected to a power source applying a common source voltage.

3. The flash memory device of claim 2, wherein the well is a p-well comprising p-type impurities.

4. The flash memory device of claim 2, wherein the second dummy bit line is further connected to the common source line via a contact hole.

5. The flash memory device of claim 1, wherein the one or more main bit lines and the plurality of dummy bit lines are disposed so as to have the same width and interval therebetween.

6. The flash memory device of claim 1, further comprising:
   a first layer on which the one or more main bit lines and the plurality of dummy bit lines are disposed; and
   a second layer disposed between the first layer and the semiconductor substrate in order to electrically connect the first layer to the semiconductor substrate, and comprising a metal line.

7. The flash memory device of claim 6, wherein the second dummy bit line is electrically connected to a voltage source applying a common source voltage, and is electrically connected to the common source line via the metal line of the second layer.

8. The flash memory device of claim 1, wherein the flash memory device is a NAND-type flash memory.

9. A flash memory device, the flash memory device comprising:
   a plurality of bit lines disposed across a cell array region and a page buffer region of the flash memory device based on DPT,
   wherein the plurality of bit lines include one or more main bit lines each connected to memory cells that are used to store data, and at least two dummy bit lines each connected to dummy cells that are not used to store data,
   wherein the one or more main bit lines and the at least two dummy bit lines are arranged based on DPT, the one or more main bit lines and the at least two dummy bit lines being disposed to have the same width and interval therebetween, and
   wherein at least one of the one or more main bit lines and the at least two dummy bit lines do not include a trim region in the cell array region and the page buffer region, and
   wherein the at least two dummy bit lines include a first dummy bit line which is adjacent to the main bit line and a second dummy bit line which is not adjacent to the main bit line, and the first dummy bit line is disposed parallel to the second dummy bit line.

10. The flash memory device of claim 9, further comprising a common source line transferring a common source voltage, and disposed on a different layer from a layer on which the one or more main bit lines and the at least two dummy bit lines are disposed,
    wherein the first dummy bit line is electrically connected to a well of a semiconductor substrate, and the second dummy bit line is electrically connected to a voltage source applying a common source voltage.

11. A flash memory device in which bit lines are disposed based on DPT, the flash memory device comprising:
    one or more main bit lines connected to a cell string including a memory cell storing data;
    one or more dummy bit lines disposed parallel to the one or more main bit lines;
    a common source line transferring a common source voltage, and disposed on a different layer from a layer on which the one or more main bit lines and the one or more dummy bit lines are disposed; and
    a page buffer temporally storing data when the flash memory device reads or writes the data, and including a first region to which a high voltage is applied and a second region to which a low voltage is applied,
    wherein the first region and the second region are electrically connected to each other via a conductive line disposed on a different layer from the layer on which the one or more main bit lines and the one or more dummy bit lines are disposed, and
    wherein one end of the conductive line is connected to an active region of a semiconductor substrate and electrically connected to at least one of the main bit lines through the active region, and the other end of the conductive line is connected to the second region of the page buffer.

12. The flash memory device of claim 11, wherein the layer comprising the conductive line is disposed between a semiconductor substrate and the layer on which the one or more main bit lines and the one or more dummy bit lines are disposed.

13. The flash memory device of claim 12, wherein each conductive line is disposed in correspondence to a pair of even and odd main bit lines from among the one or more main bit lines.

14. The flash memory device of claim 11, wherein at least one of the one or more main bit lines and the one or more dummy bit lines do not comprise a trim region in the cell array region and the page buffer region.

15. The flash memory device of claim 11, wherein the one or more dummy bit lines include a first dummy bit line transferring a first voltage and a second dummy bit line transferring a second voltage.

16. The flash memory device of claim 15, wherein the first dummy bit line is adjacent to the one or more main bit lines, and wherein the second dummy bit line is not adjacent to the one or more main bit lines.

17. The flash memory device of claim 16, wherein the first dummy bit line is electrically connected to a well of a semiconductor substrate, and wherein the second dummy bit line is electrically connected between the common source line and a voltage source applying a common source voltage.

18. A layout method for a flash memory device based on DPT, the method comprising:

disposing a plurality of word lines transferring a word line voltage and a common source line transferring a common source voltage;

disposing a plurality of bit lines so as to have the same width and interval therebetween, wherein the plurality of bit lines includes one or more main bit lines that are used to store data and a plurality of dummy bit lines that are not used to store data; and applying a first voltage to a first dummy bit line of the plurality of dummy bit lines, and applying a second voltage to a second dummy bit line of the plurality of dummy bit lines, wherein at least one of the one or more main bit lines and the plurality of dummy bit lines do not comprise a trim region in the cell array region and the page buffer region since a trim process is not performed, and wherein the first dummy bit line is adjacent to the main bit line and the second dummy bit line is not adjacent to the main bit line, and the first dummy bit line is disposed parallel to the second dummy bit line.

19. The method of claim 18, wherein the first dummy bit line is adjacent to the one or more main bit lines, and wherein the second dummy bit line is not adjacent to the one or more main bit lines.

20. The method of claim 18, further comprising disposing a metal layer connecting the second dummy bit line to the common source line between a semiconductor substrate and a layer on which the plurality of bit lines are disposed.

21. The method of claim 18, wherein a page buffer included in the flash memory includes a first region to which a high voltage is applied and a second region to which a low voltage is applied, and wherein the first region and the second region are electrically connected to each other via a conductive line disposed on a different layer from the layer on which the plurality of bit lines are disposed.

22. The method of claim 21, wherein the layer on which the conductive line is disposed between a semiconductor substrate and the layer on which the plurality of bit lines are disposed.

* * * * *